US012805275B2

(12) United States Patent
Cutler et al.

(10) Patent No.: US 12,805,275 B2
(45) Date of Patent: Nov. 17, 2026

(54) METHOD OF CORRECTING WAFER BOW USING A DIRECT WRITE STRESS FILM

(71) Applicant: Tokyo Electron Limited, Tokyo (JP)

(72) Inventors: Charlotte Cutler, Hopkinton, MA (US); Michael Murphy, Latham, NY (US); David Conklin, Saratoga Springs, NY (US)

(73) Assignee: Tokyo Electron Limited, Tokyo (JP)

( * ) Notice: Subject to any disclaimer, the term of this patent is extended or adjusted under 35 U.S.C. 154(b) by 604 days.

(21) Appl. No.: 17/703,072

(22) Filed: Mar. 24, 2022

(65) Prior Publication Data

US 2022/0336226 A1 Oct. 20, 2022

Related U.S. Application Data

(60) Provisional application No. 63/175,123, filed on Apr. 15, 2021.

(51) Int. Cl.
*G03F 7/00* (2006.01)
*H10P 95/90* (2026.01)

(52) U.S. Cl.
CPC .......... *H10P 95/906* (2026.01); *G03F 7/0035* (2013.01)

(58) Field of Classification Search
None
See application file for complete search history.

(56) References Cited

U.S. PATENT DOCUMENTS 9,397,051 B2 7/2016 Uzoh
9,853,000 B2 12/2017 Uzoh
10,353,295 B2 7/2019 Dmitriev et al.
10,804,221 B2 10/2020 Ito et al.
11,201,057 B2 12/2021 Falk et al.
2005/0147918 A1* 7/2005 Weber ..................... G03F 7/038 430/270.1
2013/0082358 A1 4/2013 Aida et al.
(Continued)

FOREIGN PATENT DOCUMENTS

CN 1914561 A 2/2007
CN 107799451 3/2018
(Continued)

OTHER PUBLICATIONS

JP2020073694 English Translation (Year: 2024).*
(Continued)

*Primary Examiner* — Daborah Chacko-Davis

(74) *Attorney, Agent, or Firm* — Oblon, McClelland, Maier & Neustadt, L.L.P.

(57) ABSTRACT

Techniques herein include methods for forming a direct write, tunable stress film and methods for correcting wafer bow using said stress film. The method can be executed on a coater-developer tool or track-based tool. The stress film can be based on a film that undergoes crosslinking/decross-linking under external stimulus where direct write is achieved by, but is not limited to, 365 nm exposure and subsequent cure is used to "pattern-in" stress. No develop step may be required, which provides additional significant benefit in conserving film planarity. An amount of bow (or internal stress to create or affect a bow signature) can be tuned with exposure dose, bake temperature, bake time and number of bakes.

17 Claims, 8 Drawing Sheets

(56) References Cited

U.S. PATENT DOCUMENTS

| | | | | |
|---|---|---|---|---|
| 2015/0362836 | A1* | 12/2015 | Tsuchimura | G03F 7/32 430/311 |
| 2016/0293556 | A1 | 10/2016 | Uzoh | |
| 2017/0010540 | A1 | 1/2017 | Dmitriev et al. | |
| 2018/0068861 | A1* | 3/2018 | deVilliers | G06F 30/20 |
| 2019/0161638 | A1* | 5/2019 | Kido | C08K 5/49 |
| 2020/0091092 | A1 | 3/2020 | Ito et al. | |
| 2020/0118822 | A1 | 4/2020 | Falk et al. | |
| 2022/0068648 | A1 | 3/2022 | Falk et al. | |

FOREIGN PATENT DOCUMENTS

| | | | | |
|---|---|---|---|---|
| CN | 109071923 | A | 12/2018 | |
| EP | 3203320 | A1 * | 8/2017 | C08K 3/36 |
| JP | 2001-230341 | | 8/2001 | |
| JP | 2005-158929 | | 6/2005 | |
| JP | 2018-41080 | | 3/2018 | |
| JP | 2020073694 | A * | 5/2020 | |
| KR | 10-2006-0125826 | A | 12/2006 | |
| KR | 10-2015-0109454 | A | 10/2015 | |
| KR | 10-2018-0027382 | A | 3/2018 | |
| KR | 10-2018-0135890 | A | 12/2018 | |
| WO | WO 2006/054637 | A1 | 5/2006 | |

OTHER PUBLICATIONS

International Search Report and Written Opinion issued Jul. 25, 2022 in PCT/US2022/022529, 9 pages.

Combined Taiwanese Office Action and Search Report issued Nov. 12, 2025 in Taiwanese Patent Application No. 111113586 (with English translation). 8 pages.

Office Action mailed November 258, 2025, in Japanese Application No. 2023-562960.

Korean Office Action issued Nov. 26, 2025, in corresponding Korean Patent Application No. 10-2023-7037722 (with English Translation), 12 pages.

Office Action mailed Apr. 21, 2026, in Taiwanese Application No. 111113586 (w/English translation) 6 pages.

Office Action mailed Jul. 4, 2026, in Chinese Application No. 202280028480.5 filed Mar. 30, 2022 (w/English translation).

* cited by examiner

BACKGROUND

BACKGROUND

| Stress Film 1 | |
|---|---|
| Film thickness | 17 um |
| Coat | 300rpm/s hold at 1500rpm 30s |
| Softbake | 65 °C, 2 min<br>95 °C, 7 min |
| Exposure | i-line 250 mJ/cm²<br>100 mm saddle |
| PEB | 95 °C, 10 min w/ rapid cool |
| **1st CURE** | **175 °C 10 min** |
| **2nd CURE** | **200 °C, 10 min** |
| **3rd CURE** | **200 °C, 5 min** |

| Stress Film 2 | |
|---|---|
| Film thickness | 17 um |
| Coat | 300rpm/s hold at 1500rpm 30s |
| Softbake | 65 °C, 2 min<br>95 °C, 7 min |
| Exposure | i-line 250 mJ/cm²<br>100 mm saddle |
| PEB | 95 °C, 10 min w/ rapid cool |
| **1st CURE** | **175 °C 10 min** |
| **2nd CURE** | **200 °C, 10 min** |
| **3rd CURE** | **200 °C, 5 min** |

| Stress Film 3 | |
|---|---|
| Film thickness | 17 um |
| Coat | 300rpm/s hold at 1500rpm 30s |
| Softbake | 65 °C, 2 min<br>95 °C, 7 min |
| Exposure | i-line 250 mJ/cm$^2$<br>100 mm saddle |
| PEB | 95 °C, 10 min w/ rapid cool |
| **1$^{st}$ CURE** | **175 °C 10 min** |
| **2$^{nd}$ CURE** | **200 °C, 10 min** |
| **3$^{rd}$ CURE** | **200 °C, 5 min** |

METHOD OF CORRECTING WAFER BOW USING A DIRECT WRITE STRESS FILM

CROSS REFERENCE TO RELATED APPLICATIONS

This present disclosure claims the benefit of U.S. Provisional Application No. 63/175,123, filed on Apr. 15, 2021, which is incorporated herein by reference in its entirety.

FIELD OF THE INVENTION

The present disclosure relates to a method of semiconductor fabrication, and particularly to wafer bow mitigation.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor fabrication involves multiple varied steps and processes. One typical fabrication process is known as photolithography (also called microlithography).

Photolithography uses radiation, such as ultraviolet or visible light, to generate fine patterns in a semiconductor device design. Many types of semiconductor devices, such as diodes, transistors, and integrated circuits, can be constructed using semiconductor fabrication techniques including photolithography, etching, film deposition, surface cleaning, metallization, and so forth.

Exposure systems (also called tools) are used to implement photolithographic techniques. An exposure system typically includes an illumination system, a reticle (also called a photomask) or spatial light modulator (SLM) for creating a circuit pattern, a projection system, and a wafer alignment stage for aligning a photosensitive resist-covered semiconductor wafer. The illumination system illuminates a region of the reticle or SLM with a (preferably) rectangular slot illumination field. The projection system projects an image of the illuminated region of the reticle pattern onto the wafer. For accurate projection, it is important to expose a pattern of light on a wafer that is relatively flat or planar, preferably having less than 10 microns of height deviation. Thus, a method for correcting any wafer bow is desired.

SUMMARY

The present disclosure relates to a method of processing a substrate, including forming a bow modification stress film on a backside of a wafer, the wafer including a working surface and the backside opposite the working surface, the bow modification stress film including a stress-modification agent, the bow modification stress film being sensitive to a predetermined wavelength of actinic radiation; exposing the bow modification stress film to a pattern of the actinic radiation at the predetermined wavelength, the bow modification stress film configured to release the stress-modification agent at locations along the bow modification stress film exposed to the pattern of the actinic radiation, a concentration of the released stress-modification agent corresponding to the pattern of the actinic radiation; and executing a curing process, the curing process activating the released stress-modification agent and causing a stress change within the bow modification stress film, the stress change modifying a bow of the wafer.

The present disclosure additionally relates to a method of processing a substrate, including forming a first bow modification stress film on a backside of a wafer, the wafer including a working surface and the backside opposite the working surface, the first bow modification stress film configured to release a first stress-modification agent in response to actinic radiation having a first predetermined wavelength; forming a second bow modification stress film on the first bow modification stress film, the second bow modification stress film configured to release a second stress-modification agent in response to the actinic radiation having a second predetermined wavelength; exposing the first bow modification stress film and the second bow modification stress film to a first pattern of the actinic radiation at the first predetermined wavelength, the first bow modification stress film configured to release the first stress-modification agent at locations along the first bow modification stress film exposed to the first pattern of the actinic radiation, a concentration of the released first stress-modification agent corresponding to the first pattern of the actinic radiation; exposing the first bow modification stress film and the second bow modification stress film to a second pattern of the actinic radiation at the second predetermined wavelength, the second bow modification stress film configured to release the second stress-modification agent at locations along the second bow modification stress film exposed to the second pattern of the actinic radiation, a concentration of the released second stress-modification agent corresponding to the second pattern of the actinic radiation; and executing a curing process, the curing process activating the released first stress-modification agent and the released second stress-modification agent, the curing process causing a first stress change within the first bow modification stress film and a second stress change within the second bow modification stress film, the first stress change and the second stress change together modifying a bow of the wafer.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

Figure 1A:
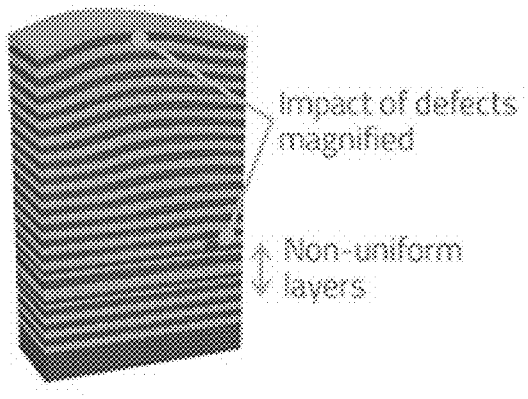
FIG. 1A is a perspective-view schematic of layers on a wafer having a defect introduced in one of the layers.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as “top,” “bottom,” “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Described herein are techniques for providing a spin-on, direct write, tunable stress film and methods for correcting wafer bow. The process herein can be executed on a coater-developer tool (also known as a track tool). Such techniques achieve corrective wafer bow with fewer and cheaper steps. The spin-on film can be based on a film that undergoes crosslinking/decrosslinking under external stimulus where direct write is achieved by, but is not limited to, 365 nm exposure and subsequent cure is used to “pattern-in” stress. Moreover, the film need not be limited to a spin-on process, and other deposition methods may be used. A develop step is not required with techniques herein (but can be optional), which provides additional significant benefit. An amount of bow (or internal stress to create or affect a bow signature) can be tuned with exposure dose, bake temperature, bake time and number of bakes. The stress-modification films herein, however can be organic in nature and have the characteristics or components to crosslink upon exposure to light, or crosslink after light exposure followed by a bake or cure step. The nature of the film can also allow for backside wafer coating.

Figure 1B:
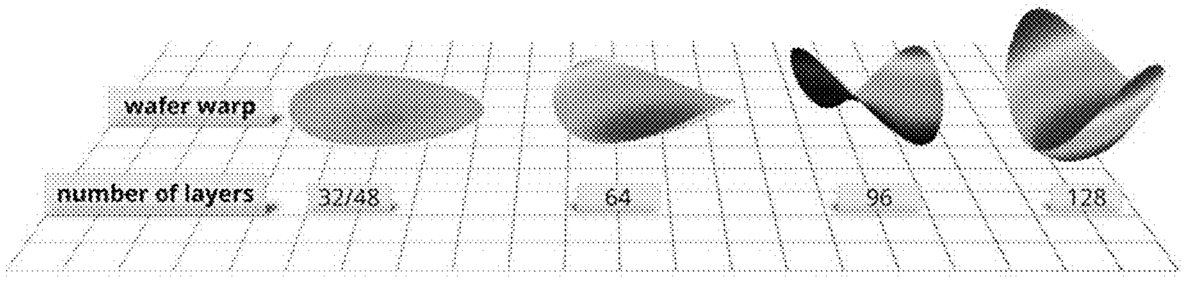
FIG. 1B is a schematic of various types and severities of resulting wafer bow.

In the fabrication of 3D NAND memory devices, the device structures can extend vertically away from a working surface of a wafer. As more and more memory is being stored on these devices, the devices become heavier. FIG. 1A is a perspective-view schematic of layers on a wafer having a defect introduced in one of the layers. For example, 128 layers can be used for 3D NAND devices on a 300 mm wafer. As shown, a defect in an underlaying, earlier layer can be magnified to cause severe bow with later layers. FIG. 1B shows the systematic increase in the number of layers in the front side 3D NAND stack results in further wafer bow and increases the severity of the problem. This can cause issues including non-uniformities, non-planarity, overlay mismatch for lithography or other processes, and wafer handling degradation.

Some mitigation strategies include depositing silicon nitride films on the backside of the wafer via, for example, chemical vapor deposition (CVD), which can cause a large amount of stress on the wafer and the devices. Then, predetermined portions of the silicon nitride can be imaged, illuminated, or exposed, and subsequently removed, alleviating the stress in certain points on the wafer, hence reshaping the wafer in a different manner. The problem introduced via the silicon nitride film method is that the method requires different tooling, which can mean a simple track-based process may be incompatible, and thus it can require loading the wafers into an entirely different tool. Furthermore, the method can also be time-consuming to put the desired amount of silicon nitride on the back of the wafers. Additionally, the method is generally a very complex process to image the silicon nitride films or to tune the patterns in the silicon nitride film to alleviate the bow of the water.

Described herein, an organic-based, cross-linkable bow mitigation film can be deposited on the backside of a wafer. The bow mitigation film can allow flexibility in global as well as local bow mitigation. In an embodiment, global bow mitigation can be applied to the film. In an embodiment, local bow mitigation can be applied via a programmable direct write stress pattern on the film on the backside of the wafer, wherein the direct write stress pattern can be based on a bow modification stress map (herein referred to as “stress map) of the front side. Notably, the bow mitigation film is a polymer-based, organic film that is deposited on the backside of the wafer using tools that can allow continuous processing in a track-based process. A predetermined wavelength of actinic radiation can be applied to image, illuminate, or expose the film based on the stress map to embed stress into the film and thereby the wafer that mitigates the undesirable bow on the opposite side or surface. Furthermore, the exposure process, which can include an exposure step and a heat or bake step, need not require a develop step. Thus, this method can be deemed a direct-write process to produce the bow mitigation film. The bow mitigation film can also be described as a stress film, in that the film can be embedded with stress to mitigate the wafer bow.

In relation to the bow affect on fabrication tools, the tool can handle (i.e., move, transport, and manipulate) wafers but can experience handling issues when wafer bow approaches and exceeds 300 μm. Notably, methods described herein can allow an increase of secondary bow mitigation up to 150 μm while maintaining 300-400 μm primary bow mitigation. Although this is a direct-write, a develop step can still be included. The develop step can allow flexibility in higher cure temperatures when unexposed material is present in the areas that have not been exposed to light. If, for example, a photoacid generator decomposition temperature is not high, these areas can also be crosslinked at high temperatures.

In terms of chemistry, methods described herein can leverage chemistries including epoxy acrylates, epoxy novolaks, benzene cyclobutadiene (BCB) chemistry where Diels Alder reactions can induce crosslinking, and polyimides. Other types of chemistry that can be used include any photo-initiating chemistry that causes crosslinking or bond rearrangement to form some type of stress upon irradiation and subsequent heating, or just exposure. If wafer bow can be mitigated using a backside coat on a track, the complicated silicon nitride film deposition process can be avoided.

In an embodiment, an organic formulation can be deposited on the surface of a wafer through a spin coat process or any deposition process. The film can be baked to remove excess solvent. The film can then be exposed to a pattern of actinic radiation. This pattern of actinic radiation can define a stress modification pattern or can be based on a stress modification pattern. Various lithography tools can be used. Preferably a direct-write laser or lithography tool can be used. This can be a digital light processing (DLP) chip, laser galvanometer, etc., that projects a pattern as one image or as a scan. In an embodiment, a mask-based lithographic exposure using a scanner or stepper tool can be used. Although direct-write tools have lower resolution than mask-based tools, the resolution needed to fine tune stress can be much lower as compared to patterning transistors. Also, a stress map created with a mask can be static, whereas using a direct-write tool can be dynamic so a stress map can be created or projected and changed on a wafer-by-wafer basis if desired.

Described herein, the wavelength of light (i.e., the actinic radiation) can be 365 nm, but other wavelengths can be used as well. Wavelength can be dependent on components included in a given organic film. Embodiments herein can also include using multiple films that respond to different wavelengths of light. After exposure, the film can be heated during a post exposure bake. A develop step, however, is not required and the film can then be cured at a higher temperature, the time and temperature of which can be dependent on the thickness of the film and the amount of stress required. Note that a development step can be executed before curing, but this is optional. Curing temperature should be high enough to induce a more complete crosslinking within the film. Upon initial flood exposure and curing of the organic stress film wafer bow of tens or hundreds of microns can be achieved.

Figure 2A:
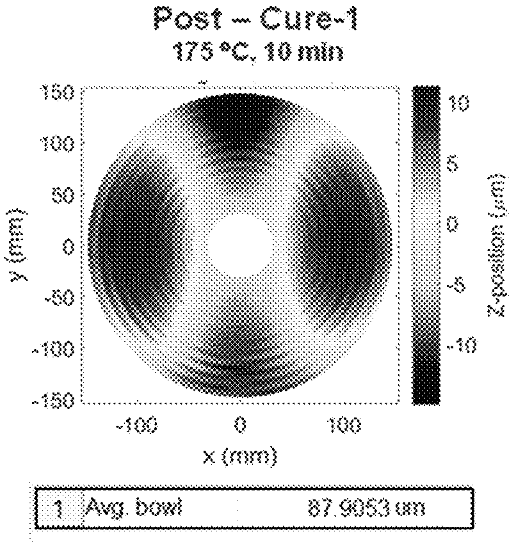
FIGS. 2A-2C are stress maps for a bow mitigation stress film arranged on a wafer and exposed to actinic radiation, according to an embodiment of the present disclosure.
Figure 2B:
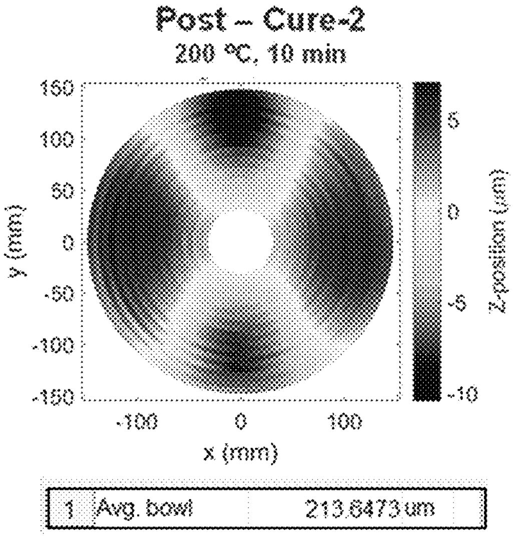
Figure 2C:
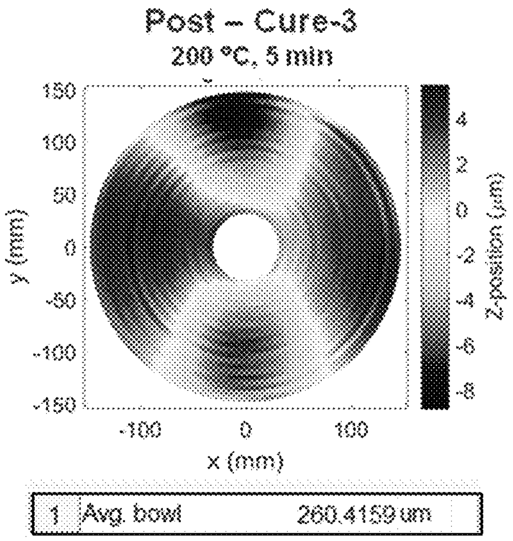

Referring now to the figures, FIGS. 2A-2C are stress maps for a bow mitigation stress film arranged on a wafer and exposed to actinic radiation, according to an embodiment of the present disclosure. In an embodiment, the wafer can include a first surface and a second surface. For example, the first surface of the wafer can be a working surface where the target devices are fabricated and the second surface can be a backside of the wafer. The backside of the wafer can have the bow modification stress film (herein referred to as "stress film") formed thereon. The stress film can be an organic film, or a polymer-based film.

In an embodiment, FIGS. 2A-2C demonstrate how the organic stress film can affect wafer bow. The stress film can be deposited on the backside of the wafer via, for example, spin-coating. Other deposition processes can be contemplated, such as sputter coating, spray coating, doctor blading, CVD, physical vapor deposition (PVD), and atomic layer deposition (ALD), among others. The stress film can be exposed according to a predetermined pattern or shape, such as a strip of the stress film through a middle of the wafer. As shown in FIGS. 2A-2C, a 100 mm strip of the stress film was exposed down a middle of the wafer and exposed to light having a 365 nm wavelength. The wafer including the exposed stress film can be heated during a post-exposure bake, then cured at higher temperatures. Additional cure steps can increase wafer bow, allowing for the tunable stress film. Each of the stress maps is accompanied by a same table including additional process information for reference.

FIGS. 2A-2C show process conditions in the table (left) and corresponding stress maps for an epoxy novolak film with resulting saddle pattern images through a center of the wafer.

In FIG. 2A, a first cure was performed at 175° C. for 10 minutes, which resulted in a wafer bow of approximately 88 μm for the stress film having a thickness of 17 μm.

In FIG. 2B, a second cure was performed at 200° C. for an additional 10 minutes, which resulted in a wafer bow of approximately 214 μm.

In FIG. 2C, a third cure was performed at 200° C. for an additional 5 minutes, which resulted in a wafer bow of approximately 260 μm.

As previously mentioned, the chemistries included in such stress films can include, but are not limited to, epoxy acrylates, epoxy novolaks, BCB chemistry where Diels Alder reactions can induce crosslinking, and polyimides. Again, the wafer bows shown in FIGS. 2A-2C demonstrate that the stress film can indeed cause wafer bow, and as such, can be used on a wafer already bowed due to the devices fabricated thereon in order to mitigate or correct said wafer bow.

As described above, coater developer systems can be used for spin-on deposition of stress films herein. These tools can include multiple modules for coating wafers, baking wafers, and developing films. Coater-developer tools described herein can also include direct-write exposure modules. The coater developer system can then shuttle wafers between the various spin coating, baking/curing modules, and exposure modules, or to an attached scanner/stepper tool. Moreover, the coater developer tools described herein can also include point-of-dispense mixing. That is, chemicals can be mixed at or proximate to a dispense nozzle, immediately prior to dispensing on the wafer. For example, a solvent can be added to a resist at the nozzle to modulate viscosity or film thickness.

Techniques herein can be used to mitigate or counter bowing from microfabrication processes. The stress films herein can be deposited multiple times through a given microfabrication process. For example, as previously mentioned, 3D NAND memory devices can have film stacks of 128 layers or more to create memory devices. This layer stack can put significant stress on the wafer, resulting in bowing making overlay errors a problem. Likewise, 3D logic is expected to have many layers and a similar need to correct wafer bow.

Figure 3:
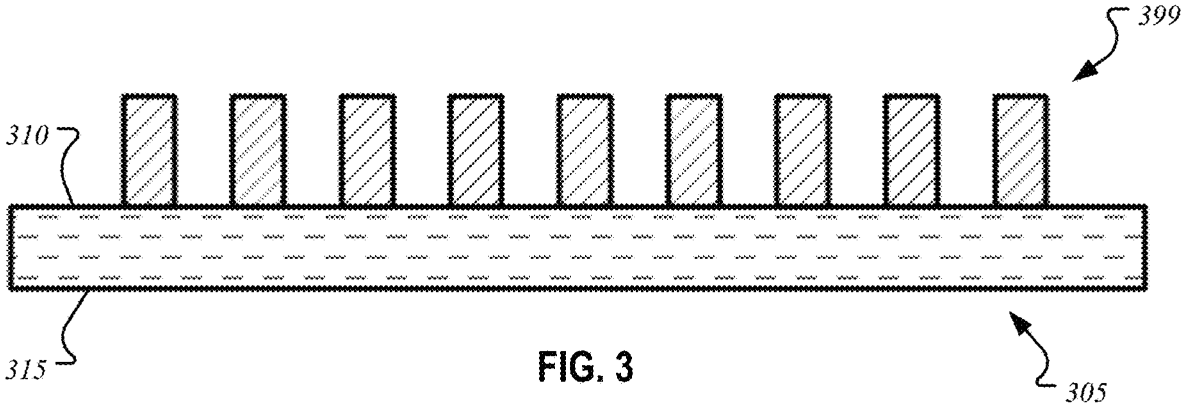
FIG. 3 is a cross-sectional substrate segment illustrating structures or devices formed on a surface, according to an embodiment of the present disclosure.

To this end, FIG. 3 is a cross-sectional substrate segment illustrating structures or devices 399 formed on a surface, according to an embodiment of the present disclosure. In an embodiment, a wafer 305 includes a first surface 310 and a second surface 315. For example, the first surface 310 of the wafer can be a working surface where the target devices are fabricated and the second surface 315 can be a backside of the wafer. The devices 399 formed on the working surface 310 can be active devices or partially formed active devices such as transistors or memory cells. The wafer 305 can be received in a coating module of a coater-developer tool or other track-based tool.

Figure 4:
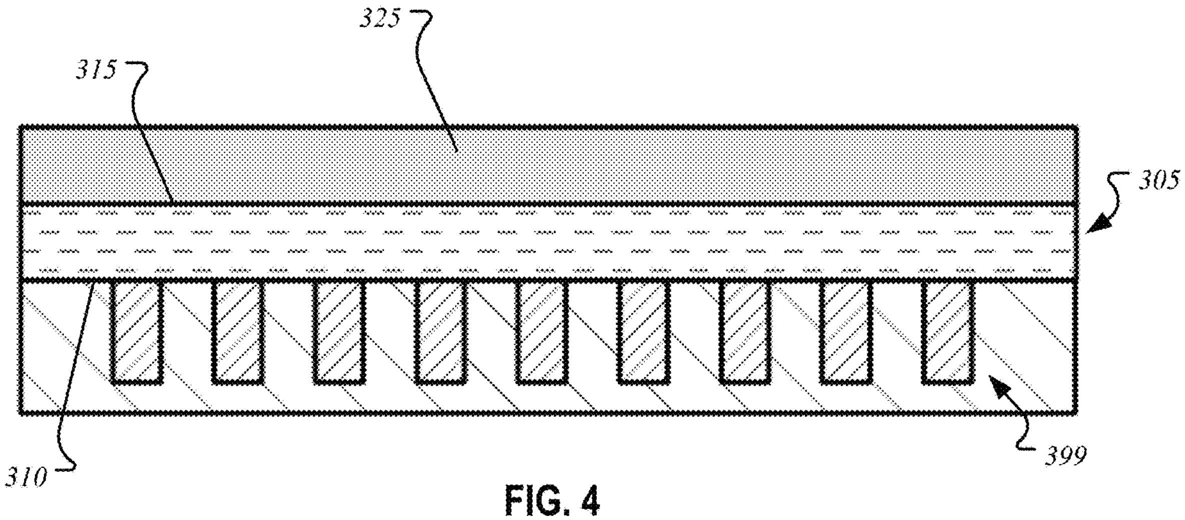
FIG. 4 is a cross-sectional substrate segment illustrating a bow modification stress film formed on the backside of the wafer, according to an embodiment of the present disclosure.

FIG. 4 is a cross-sectional substrate segment illustrating a bow modification stress film 325 (herein referred to as "stress film 325") formed on the backside 315 of the wafer 305, according to an embodiment of the present disclosure. In an embodiment, the wafer 305 can be flipped and the stress film 325 can be formed on the backside 315, but the wafer 305 need not be flipped. For example, the tool can include systems for vertically upward directed coating, spraying, or deposition. That is, the wafer 305 can continue on the track and the tool can form the stress film 315 on the backside 315 of the wafer by spray coating. In any case, the stress film 325 can be formed on the backside 315, and the stress film 325 can be an organic film configured to release a stress-modification agent in response to actinic radiation. That is, the stress film 325 can include one or more photo acid generators, thermal acid generators, photo initiators, photo destructive bases, or the like. As indicated above, the stress film 325 can include various epoxy materials or resins or other organic materials that will result in stresses (tensile or compressive) within the stress film 325 from curing in the presence of acids, bases, or radicals. For the devices 399 arranged on the working surface 310, a protective fill or protective film can be deposited, or a carrier wafer can be attached, to facilitate handling of the wafer 305.

Note that working surface 310 and the backside 315 are used herein to label opposing sides of the wafer 305. In some microfabrication processes, a given wafer can have active devices or power delivery structures formed on both sides. In this case, either the working surface 310 or the backside 315 can receive the stress film 325 depending on fabrication process stage.

Figure 5:
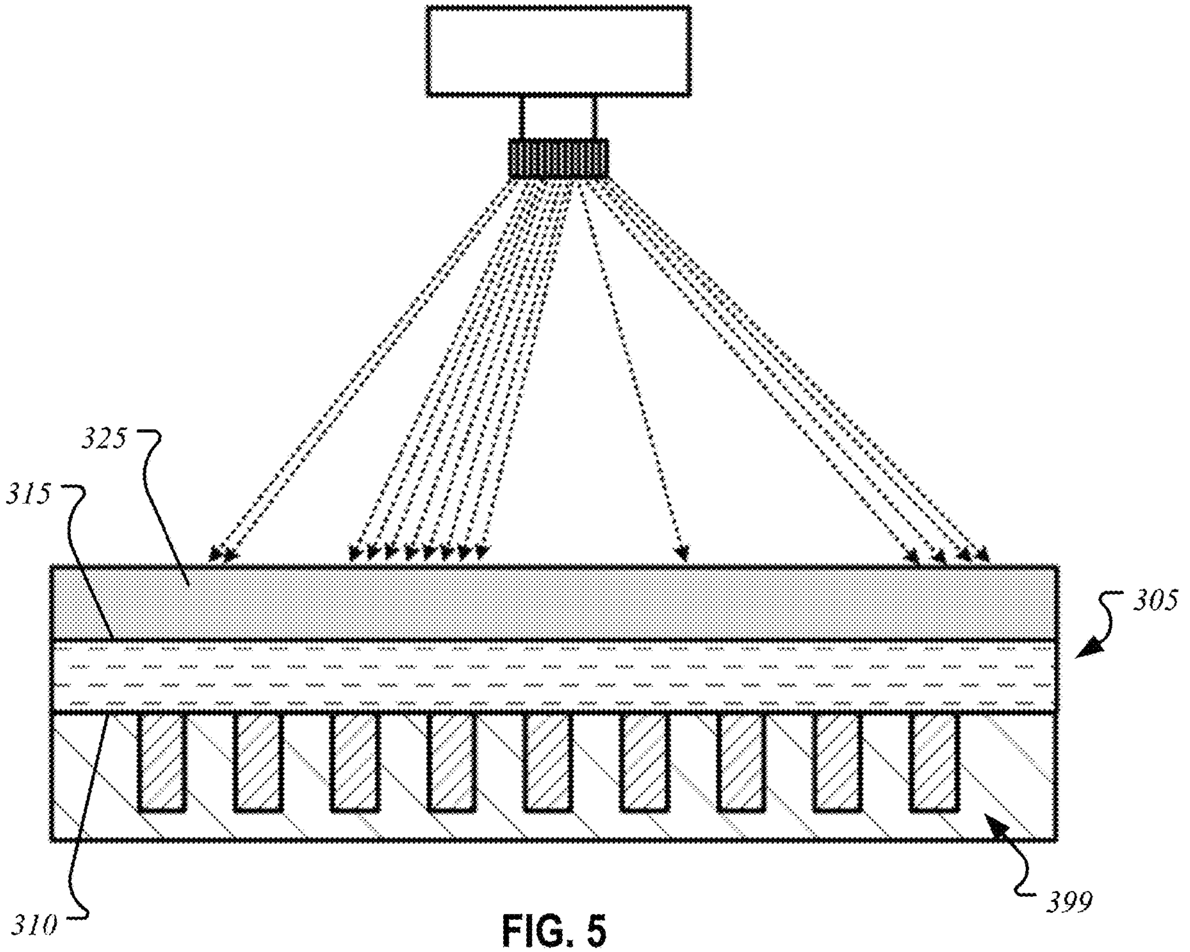
FIG. 5 is a cross-sectional substrate segment illustrating exposure of the stress film, according to an embodiment of the present disclosure.

FIG. 5 is a cross-sectional substrate segment illustrating exposure of the stress film 325, according to an embodiment of the present disclosure. In an embodiment, the stress film 325 can be exposed to a pattern of actinic radiation that releases the stress-modification agent within the stress film 325. This exposure step can be executed within a direct write module on the coater-developer tool or be transferred to a separate or connected tool for exposure. The actinic radiation can be patterned wherein more or less radiation is received at coordinate locations on the backside 315 of the wafer 305 having the stress film 325. Resolution can be dependent on a particular lithography system selected for executing the exposure. A concentration of the stress-modification agent released at a given coordinate location can be based on the pattern of the actinic radiation illuminating the stress film 325. This is represented by the more densely shaded portions of the stress film 325 in FIG. 6.

Figure 6:
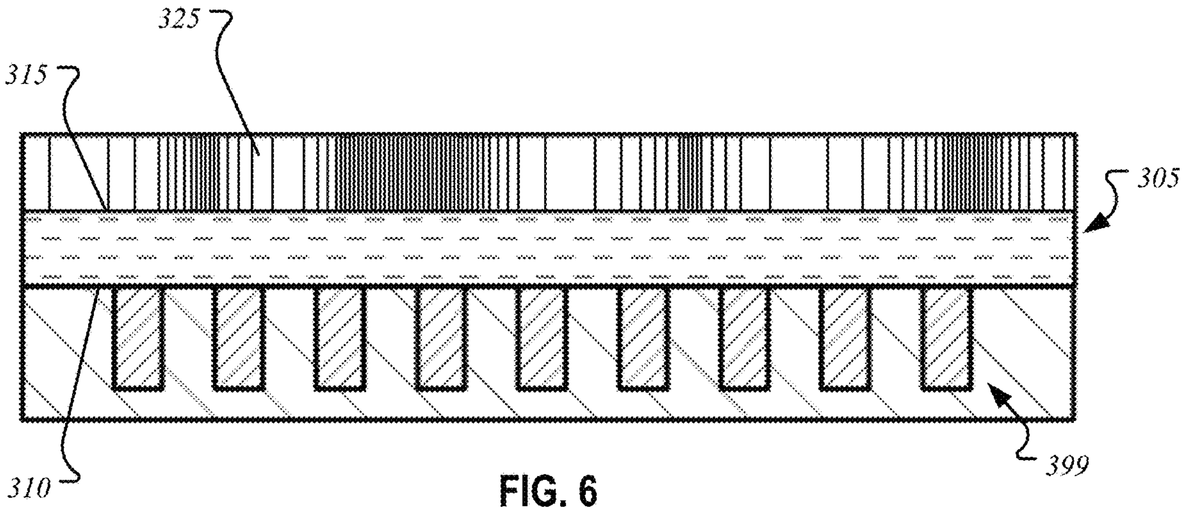
FIG. 6 is a cross-sectional substrate segment illustrating the stress film after exposure, according to an embodiment of the present disclosure.

FIG. 6 is a cross-sectional substrate segment illustrating the stress film 325 after exposure, according to an embodiment of the present disclosure. In an embodiment, one or more curing steps can be executed, such as those described in FIGS. 2A-2C. The wafer 305 can be transferred to a bake/curing module of the coater developer tool. The curing process can activate the stress-modification agent in the stress film 325 and cause a modified stress within the stress film 325 sufficient to modify bow of the wafer 305. For example, upon exposure to light, a photoacid generator (PAG) (in a non-limiting example) can produce a photoacid which in turn catalyzes an epoxy crosslinking reaction upon bake and cure. It is the crosslinking reaction in the stress film 325 that causes the stress mitigation. In some embodiments, the imaging or exposure to the pattern of actinic radiation can directly change the stress film 325 and thereby directly change or modify bow of the wafer 305. For example, the stress can be alleviated with imaging and removing bonding interactions, such as hydrogen bonding interactions, via the patterned exposure. That is, instead of inducing stress, the patterned exposure can relieve the stress through activating, for example, a photoactive compound (PAC) and removing the inhibition effect of the pre-exposed PAC. The modified stress can be caused by crosslinking, modified bonds among species, or other entanglement. The amount of, for example, cross-linking of the stress film 325 via the stress-modification agent can correspond to the concentration of the stress-modification agent released at the given coordinate location based on the pattern of the actinic radiation. Depending on agents and film properties, the stress can be tensile or compressive internal stress. The resulting stress in the stress film 325 can then, for example, counter-act stresses in the wafer from microfabrication process steps. FIG. 6 illustrates the stress film 325 having more or less stress by coordinate location in the stress film 325 based on the projected pattern of light and curing step or steps.

Accordingly, a warped wafer can be flattened with the stress film 325 described herein. The direct write programmable pattern essentially activates (or pre-activates) stress through cross-linking or chemical transformation that is activated by a particular wavelength of light or electromagnetic energy that can include longer wavelengths in the infrared (IR) or thermal regions. The IR wavelengths can be used to pattern the stress film 325 through the wafer 305, that is, exposed through the working surface 310. However, device fabrication on the working surface of the wafer may impair the ability to pattern the stress film 325 through the wafer, particularly at later stages of the device fabrication process. In some embodiments, the backside film may be activated using a wafer chuck with spatial temperature control either in the track device or in the device fabrication equipment. Stress activation can be tailored using different wavelengths of light based on additives instead of a polymer in a given organic film. The stress film 325 herein therefore induces a counter stress instead of releasing stress as with etched films, but no etch step is needed. In some embodiments, the wafer can be flipped over (such as the wafer of FIG. 5) so the electromagnetic energy is being patterned onto the side that is being imaged instead of via the backside 315.

As previously described, a developing process or step can be executed before curing. If the developing process is executed, a mismatch in the height on the backside of the wafer can result. Thus, a fill can be deposited or formed over the stress film 325 on the backside. The backfill can then be planarized prior to flipping the wafer 305 back over for continued fabrication and processing, otherwise the mismatch of the film height in specific locations could itself induce mis-shape of the wafer 305. However, this should further highlight the benefit of the direct write control, wherein a develop process is not needed and does not result in an sort of film height mis-match. In direct write, a planar film can be formed, bow can be induced, and the film remains planar.

In an embodiment, two or more stress films 325 can be deposited. Each given film can be activated by a same or different wavelength. This multi-layer process can be used to create cumulative or differential stress. For lower resolution wafer bow correction, films herein can be activated simply by targeted or patterned heating without a photo-activated pattern step (i.e., global bow mitigation). A zone-based heating or mask-based heating cure or microwave heating can cause location-specific crosslinking. In this case, either a photo acid generator (PAG) or thermal acid generator (TAG) can be used because most PAGs can act as TAGs at sufficiently high temperatures.

In an embodiment, backside integration of the stress films can lead to tradeoffs that can impact device yield. With design technology co-optimization where a multi-directional actuation stress film is planned for front-side integration, the benefits of the technology may be realized without the trade-off. In such an implementation, the stress film 325 can be formed on the working surface 310, such as in areas between devices on the wafer 305, along a periphery of the working surface 310, or even on top of the devices.

Techniques herein can affect wafer bow of hundreds of microns, which is sufficient to counteract wafer bow and warpage observed on wafers during semiconductor manufacturing. Resulting bow modification herein can be first order and second order bowing correction, such as a saddle bow. Techniques herein can be used throughout the semiconductor fabrication process. For example, after an initial bow is corrected with films herein, additional processing can be executed. This additional processing can in turn result in additional warpage. At this point, a second bow-modification film can be added, patterned, and then cured. Alternatively, the first bow-modification film is stripped, then the wafer warpage is measured a second time, and then a subsequent bow-modification is deposited and patterned according to the second wafer bow measurement.

Figure 7:
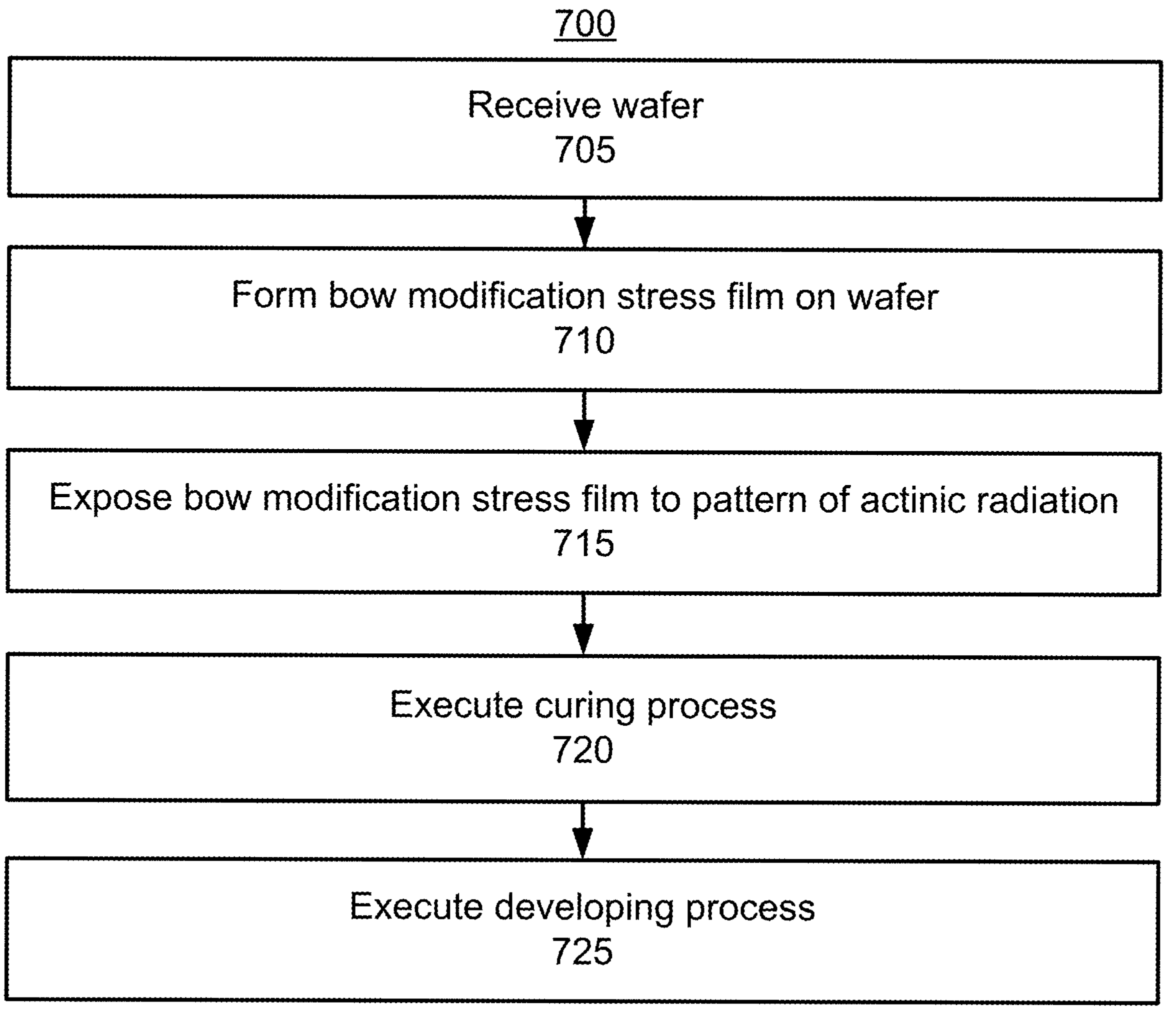
FIG. 7 is a flow chart for a method of fabricating a semiconductor device, according to an embodiment of the present disclosure.

FIG. 7 is a flow chart for a method 700 of processing a substrate, according to an embodiment of the present disclosure.

In step 705, the wafer 305 can be received by the tool, the wafer 305 include the first surface 310 (the working surface 310) and the second surface 315 (the backside 315).

In step 710, the stress film 325 can be formed on the backside 315 of the wafer 305. The stress film 325 can include a stress-modification agent, the stress film 325 being sensitive to the predetermined wavelength of the actinic radiation.

In step 715, the stress film 325 can be exposed to the pattern of the actinic radiation at the predetermined wavelength. The stress film 325 can be configured to release the stress-modification agent at locations along the stress film 325 exposed to the pattern of the actinic radiation. A concentration of the released stress-modification agent can correspond to the pattern of the actinic radiation.

In step 720, the curing process can be executed. The curing process can activate the released stress-modification agent and cause a stress change within the stress film 325 to modify a bow of the wafer 305 and bring the wafer 305 closer to planarity.

In step 725, the developing process can optionally be executed before curing.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of processing a substrate, the method comprising:

forming a bow modification stress film on a backside of a wafer, the wafer including a working surface and the backside opposite the working surface, the bow modification stress film including a stress-modification agent, the bow modification stress film being sensitive to a predetermined wavelength of actinic radiation;

exposing the bow modification stress film to a pattern of the actinic radiation at the predetermined wavelength, wherein the bow modification stress film remains planar during and after the exposure, without forming a relief structure or any topographical pattern corresponding to the pattern of the actinic radiation, and without undergoing a development step, the bow modification stress film configured to release the stress-modification agent at locations along the bow modification stress film exposed to the pattern of the actinic radiation, a concentration of the released stress-modification agent corresponding to the pattern of the actinic radiation; and executing a curing process, the curing process activating the released stress-modification agent and causing a stress change within the bow modification stress film, the stress change modifying a bow of the wafer, wherein a material of the bow modification stress film is at least one selected from the group consisting of epoxy acrylate and epoxy novolak, and wherein the bow modification stress film includes a photo initiator that generates a radical in response to the predetermined wavelength of the actinic radiation.

2. The method of claim 1, wherein the curing process activating the released stress-modification agent further comprises causing crosslinking within the bow modification stress film based on the pattern of the actinic radiation.

3. The method of claim 1, wherein the bow modification stress film includes a photo acid generator that generates acid in response to the predetermined wavelength of the actinic radiation.

4. The method of claim 1, wherein the steps of forming the bow modification stress film, exposing the bow modification stress film to the pattern of the actinic radiation, and executing the curing process are executed without introducing a developer on the wafer.

5. The method of claim 1, wherein the executing the curing process further comprises applying heat to the wafer until reaching a predetermined degree of cross-linking within the bow modification stress film.

6. The method of claim 1, wherein the exposing the bow modification stress film to the pattern of the actinic radiation further comprises illuminating an intensity of actinic radiation based on a selected value of bow modification to achieve.

7. The method of claim 1, wherein the stress change modifying the bow of the wafer further comprises reducing wafer bow values across the working surface resulting in the wafer having reduced curvature as compared to prior to depositing the bow modification stress film.

8. The method of claim 1, wherein the bow modification stress film includes a photo base generator.

9. The method of claim 1, further comprising depositing a second bow modification stress film on the backside of the wafer, the second bow modification stress film including a second stress-modification agent, the second bow modification stress film being sensitive to a second predetermined wavelength of the actinic radiation;

exposing the second bow modification stress film to a second pattern of the actinic radiation, wherein the curing process activates the released second stress-modification agent and causes the stress change within the bow modification stress film, the stress change modifying the bow of the wafer.

10. The method of claim 1, further comprising depositing a second bow modification stress film on the backside of the wafer, the second bow modification stress film including a second stress-modification agent, the second bow modification stress film being sensitive to a second predetermined wavelength of the actinic radiation;

exposing the second bow modification stress film to a second pattern of the actinic radiation; and executing a second curing process, the second curing process activating the released second stress-modification agent and causing a stress change within the bow modification stress film, the stress change modifying a bow of the wafer.

11. The method of claim 10, wherein the first predetermined wavelength and the second predetermined wavelength are different.

12. The method of claim 1, wherein the pattern of actinic radiation is based on a bow modification stress map for the wafer.

13. The method of claim 12, wherein the bow modification stress map indicates stress values to mitigate across coordinate locations along the backside of the wafer.

14. The method of claim 1, wherein the bow modification stress film is deposited by spin-on deposition.

15. The method of claim 1, wherein the pattern of the actinic radiation is provided by a direct write lithography system.

16. The method of claim 1, wherein the pattern of the actinic radiation is provided by a mask-based lithography system.

17. A method of processing a substrate, the method comprising:

forming a first bow modification stress film on a backside of a wafer, the wafer including a working surface and the backside opposite the working surface, the first bow modification stress film configured to release a first stress-modification agent in response to actinic radiation having a first predetermined wavelength;

forming a second bow modification stress film on the first bow modification stress film, the second bow modification stress film configured to release a second stress-modification agent in response to the actinic radiation having a second predetermined wavelength;

exposing the first bow modification stress film and the second bow modification stress film to a first pattern of the actinic radiation at the first predetermined wavelength, wherein no develop step is performed and the exposed first and second bow modification stress films remain planar and do not form any topographical pattern corresponding to the first pattern of the actinic radiation, the first bow modification stress film configured to release the first stress-modification agent at locations along the first bow modification stress film exposed to the first pattern of the actinic radiation, a concentration of the released first stress-modification agent corresponding to the first pattern of the actinic radiation;

exposing the first bow modification stress film and the second bow modification stress film to a second pattern of the actinic radiation at the second predetermined wavelength, the second bow modification stress film configured to release the second stress-modification agent at locations along the second bow modification stress film exposed to the second pattern of the actinic radiation, a concentration of the released second stress-modification agent corresponding to the second pattern of the actinic radiation; and executing a curing process, the curing process activating the released first stress-modification agent and the released second stress-modification agent, the curing process causing a first stress change within the first bow modification stress film and a second stress change within the second bow modification stress film, the first stress change and the second stress change together modifying a bow of the wafer, wherein a material of the bow modification stress film is at least one selected from the group consisting of epoxy acrylate and epoxy novolak, and wherein the bow modification stress film includes a photo initiator that generates a radical in response to the first predetermined wavelength of the actinic radiation.

* * * * *